United States Patent [19]

Anderson, Jr. et al.

[11] Patent Number: 5,205,738

[45] Date of Patent: Apr. 27, 1993

[54] HIGH DENSITY CONNECTOR SYSTEM

[75] Inventors: Herbert R. Anderson, Jr., Patterson; Arthur Bross, Poughkeepsie; Julian G. Cempa, Deposit; Robert O. Lussow, Hopewell Junction; Donald E. Myers; Thomas J. Walsh, both of Poughkeepsie, all of N.Y.

[73] Assignee: International Business Machines Corporation, Armonk, N.Y.

[21] Appl. No.: 863,643

[22] Filed: Apr. 3, 1992

[51] Int. Cl.$^5$ ............................................. H01R 9/09
[52] U.S. Cl. ..................................... 439/59; 439/66; 439/630
[58] Field of Search ................. 439/17, 59, 62, 78, 439/81, 84, 259, 260, 265, 629, 630, 66

[56] References Cited

U.S. PATENT DOCUMENTS

| | | | |
|---|---|---|---|
| 4,249,302 | 2/1981 | Crepeau | 29/830 |
| 4,421,370 | 12/1983 | Treakle et al. | 439/66 |
| 4,707,657 | 11/1987 | Bolgh-Petersen | 439/66 |
| 4,793,814 | 12/1988 | Zifcak et al. | 439/66 |
| 4,820,376 | 4/1989 | Lambert et al. | 156/643 |
| 4,927,369 | 5/1990 | Grabbe et al. | 439/66 |
| 5,010,389 | 4/1991 | Gansauge et al. | 357/67 |
| 5,040,991 | 8/1991 | Collier | 439/630 |
| 5,137,456 | 8/1992 | Desai et al. | 439/66 |

Primary Examiner—Paula A. Bradley
Attorney, Agent, or Firm—Harold Huberfeld; Irwin Ostroff

[57] ABSTRACT

There is disclosed a high density electronic connector system in which a plastic insulating body supports on one or more levels a plurality of conductive circuit traces. Output contacts to these traces are provided by small metal balls. The metal balls are driven into tight contact with respective ones of the conductive traces and captivated by the plastic body. The balls are covered with gold and provide miniature, wear resistant closely spaced output contacts in the connector system.

14 Claims, 1 Drawing Sheet

HIGH DENSITY CONNECTOR SYSTEM

CROSS-REFERENCE TO RELATED PATENT APPLICATIONS

This patent application is related to U.S. patent application Ser. No. 07/863,645, entitled "Via and Pad Structure for Thermoplastic Substrates and Method and Apparatus for Forming the Same", which is being filed on even date herewith, and which has common inventors and a common assignee with the present patent application.

1. Field of the Invention

This invention relates to a high performance electronic connector system (such as a chip carrier connector and socket) having very high density, and to a method of fabrication of such a connector system to achieve improved performance, quality and economy compared to prior arrangements.

2. Background of the Invention

In the past decade the density per unit area of electronic devices, such as very large scale integrated (VLSI) circuits, has greatly increased. By some estimates this increase in density has been on the order of 10,000 times what it was earlier. The space or area available outside of a VLSI circuit in which to make the large number of necessary connections to and from it is becoming almost vanishingly small measured by previous standards. Contrary to the density increase of VLSI circuits, the density of the passive circuit interconnections, such as connectors, has increased (i.e., the parts decreased in size) by only a relatively small factor, for example, less than 10 to 1. This presents the difficult problem of providing connections to and from the VLSI circuits which are small enough to fit the spaces available and which are also sufficiently reliable and manufacturable to be economically useful.

The contact resistance of mating parts in an electrical connector is extensively discussed in the literature. See for example the book by Ragnar Holm entitled "Electric Contacts", published by Springer-Verlag. It is highly desirable that contact resistance remain stable at a very low value (e.g., a few milliohms) throughout the service life of the connector. An important factor in stability of the contact resistance is the character or quality of the interface or mating surfaces of the contacts. These surfaces should be free of contaminants, substantially immune to oxidation or corrosion, and should be held together with sufficient minimum force to insure intimate metal-to-metal contact. These considerations, especially where high quality electronic connectors are involved, lead to the use of gold (or a similar noble metal) in the contact areas and to contact designs which provide normal contact forces for each pair of contacts in the range of about 100 gms.

One attempt to provide ultra-miniature contacts between mating portions of electrical circuitry is shown in U.S. Pat. No. 3,971,610, to Buchoff et al. There, small individual contact buttons are affixed at selected points to the circuitry to provide mating connections to other parts of the circuitry. These contact buttons are molded of a semi-conductive elastomer, such as silicone rubber, with an admixture of conductive carbon or metal powder. However, the volume resistivity of this elastomeric mixture, while low compared to the elastomer material (rubber) alone, is of the order of a million times greater than the volume resistivity of pure copper. Moreover, the elastomer mixture of these contact buttons, as compared to spring contacts of metal, is far more subject to the ageing effects of elevated temperatures, to physical deterioration over time (oxidation, etc.), and to large, erratic changes in contact resistance. As a result, this elastomeric contact system has had only limited use and is not suitable in applications requiring high performance and where low, stable contact resistance is essential.

A chip carrier connector and socket is a widely used arrangement for making miniature, very closely spaced, connections to and from a VLSI circuit. These miniature connections are formed by fine, closely spaced printed-circuit traces (conductors) which fan out to become output contacts arranged on the surface along an edge or edges of a chip carrier. A body of the chip carrier is a thin, flat insulator (ceramic or plastic) with the printed-circuit traces placed on its top and/or bottom faces. The VLSI is typically mounted in the center of the carrie body and electrically connected to respective ones of the circuit traces.

Ceramic chip carriers (which are strong and environmentally stable) are generally more expensive than plastic ones for reasons including high temperature processing requirements, cost of materials, and other manufacturing considerations. Moreover ceramic materials have a substantially higher dielectric constant than that of the newer, high performance plastic materials which are now available. It is desirable, for a variety of reasons, to use plastic rather than ceramic for the body of a chip carrier.

The output contacts of a chip carrier in certain applications are subject to repeated insertion and withdrawal to and from the mating contacts of a socket. In order to insure low and stable electrical contact between the mating parts, normal contact forces above a safe minimum value are used. And as was explained above, a layer of gold (or similar noble metal) is provided at the contact interfaces. The contacts are typically covered with a relatively thick layer of gold because they are subject to wear by repeated insertion and withdrawal. This is expensive because of the amount of gold required and because of the added processing needed to obtain the selective application of gold to only those areas of the contacts where needed. It is desirable therefore to have a contact arrangement which minimizes these problems of cost and manufacturability.

It is desirable to provide a high density electronic connector system which provides very low, stable contact resistance together with thermal and mechanical stability, as well as ease and simplicity in mating together of the contact parts. It is also desirable to provide an economical and effective method of manufacturing and assembling such a connector system with the precision and uniformity required.

SUMMARY OF THE INVENTION

Viewed from one aspect, the present invention is directed to a high density electronic connector system (such as a chip carrier and socket). A plastic insulating body of the connector system has at least one layer of closely spaced conductive traces bonded to it. A row or rows of closely spaced output contacts are near an edge of the insulating body. Each of these contacts is a small metal ball pierced through a respective one of the conductive traces and driven into the insulating body where it is firmly supported. The ball is captivated by the plastic insulating body in conjunction with the conductive trace. The ball and trace are held in tight mechanical engagement and have low, stable electrical contact. Each ball is covered with a layer of gold which is made thick enough to prevent wear-through. An exposed portion of each ball mechanically mates with a respective spring contact of a socket assembly. The ball and spring contact provide a "detented", self-aligning mechanical and electrical joint which "wipes" itself clean and provides a desired normal contact force. They can be repeatedly mated and unmated without wear-through of the gold at the contact interface. In a somewhat different contact arrangement, the metal ball pierces a conductive trace on top of a thin insulating body. The ball is driven down through the insulating body and makes mechanical and electrical contact to a conductive trace bonded onto the bottom of the insulating body. Thus miniature electrical "vias" (connections) between layers of conductive circuitry are readily provided where desired.

View from another aspect, the present invention is directed to a method of manufacturing a connector system. A small metal ball is held against the end of a needle-like punch. A plastic insulating body having a conductive trace bonded to it is heated to an elevated temperature (but far below the melting temperature of the plastic). Then the insulating body and conductive trace are positioned beneath the punch and ball and the ball is driven with suitable force and speed through the conductive trace and into the insulating body. Where a "via" is desired, the ball (or balls) are driven through the insulating body against a conductive trace bonded underneath the body. This metal ball makes stable mechanical and electrical contact through the insulating body to the spaced apart conductive traces.

Viewed from still another aspect, the present invention is directed to an electronic connector system. The electronic connector system comprises a body of plastic insulating material, a plurality of conductive traces supported by the body, a plurality of pieces of metal, and spring contacts. The plurality of pieces of metal are seated in mechanical and electrical engagement with respective ones of the conductive traces and captivated by surrounding portions of the plastic insulating material. The spring contacts are adapted to bear against exposed portions of the respective metal pieces with a desired contact force.

Viewed from still another aspect, the present invention is directed to method of manufacturing a connector system. The method comprises the steps of placing a punch over a respective one of conductive traces of a plastic body having a plurality of conductive traces thereon, placing a piece of metal against an end of the punch, and driving the piece of metal with suitable force and speed through one conductive trace into the plastic body and against a lower conductive trace, the lower trace being dimpled by the force of the piece of metal and acting as a spring urging the piece of metal upward such that the piece of metal is tightly captivated in position.

DETAILED DESCRIPTION

Figure 1:
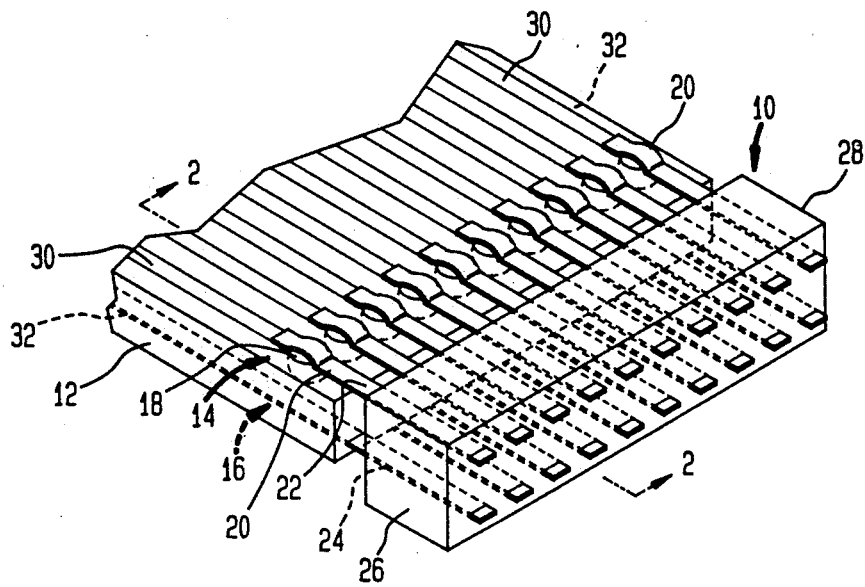
FIG. 1 is a perspective view, somewhat enlarged and partially broken away, schematically showing an electronic connector system provided in accordance with the present invention.

Referring now to FIG. 1, there is shown a connector system 10 provided in accordance with the invention. One part of the connector system 10 is an insulating body 12 which is made of a suitable plastic material. The body 12 has a top row 14 and a bottom row 16 of miniature, closely spaced surface contacts 18. These contacts 18 mate with and make electrical contact to respective spring contacts 20 arranged in a top row 22 and a bottom 24 of a socket assembly 26. The socket assembly 26 has an insulating body 28 which rigidly holds the right ends of the spring contacts 20 in the spaced apart rows 22 and 24. The outer ends of the spring contacts 20 in the insulating body 28 of the socket assembly 26 may be connected to electrical circuitry (not shown). The insulating connector body 12 may, by way of example, be a chip carrier having mounted on its center part a VLSI (not shown). Bonded to the top face of the insulating body 12 are fine, closely spaced conductive metal traces 30. Similar conductive traces 32 are bonded on the lower face of the body 12. These conductive traces 30 and 32 are advantageously of copper and made by a photographic print-and-etch process well known in the art of manufacturing printed circuits. The conductive traces 30 and 32 provide high density connections to the VLSI (not shown). As will be described shortly, the traces 30 and 32 are electrically and mechanically connected near their right ends respectively to the contacts 18 provided in accordance with an aspect of the invention and manufactured by a method provided in accordance with another aspect of the invention.

Figure 2:
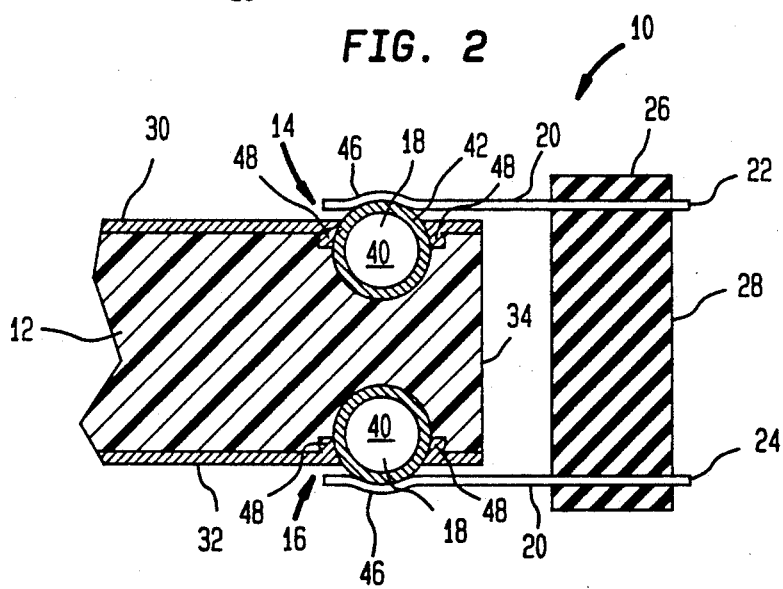
FIG. 2 is an enlarged cross-sectional view taken as indicated by the dashed lines 2—2 in FIG. 1.

Referring now to FIG. 2, there is shown a greatly enlarged cross-sectional view of the connector system 10. The insulating body 12 on its upper face has bonded to it the conductive traces 30, and on its lower face the conductive traces 32. These traces 30 and 32 are parallel to each other for a short distance from a right edge 34 of the body 12. Positioned a short distance behind this edge 34 are the upper row 14 and the lower row 16 of the contacts 18 (see also FIG. 1). Each of these contacts 18 comprises a small metal ball 40. Each metal ball 40 in the upper row 14 pierces through a respective one of the conductive traces 30 and is partially buried and anchored in the insulating body 12. Similarly the metal balls 40 in the lower row 16 respectively pierce the conductive traces 32 and are likewise anchored in the insulating body 12. The thickness of the insulating body 12 here is sufficiently large so that the balls 40 in the upper row 14 do not come in contact with the balls 40 in the lower row 16. Each of the metal balls 40 is covered with a layer 42 of gold (or similar noble metal). By way of example, these balls may be about 10 mils in diameter and the layer 42 of gold may be relatively thick (e.g., up to 100 microinches). The cost of providing this layer 42 of gold is less than in other contact systems because of the very small size of the metal balls 40, and the ease of separately covering them with the layer 42 of gold. The balls 40 are driven into the insulating body 12 a precise distance less than their diameter which leaves respective outer gold-covered portions of them exposed. The balls 40 (which are solid) and the layer 42 of gold are not drawn to scale to better illustrate that the layer 42 of gold may be as thick as desired. The exposed gold-covered portions of the balls 40 are contacted respectively by shaped (dimpled) ends 46 of the spring contacts 20, the contact surfaces of which are also gold covered. The downward force exerted by the spring contacts 20 in the upper row 22 and the opposing force exerted by the spring contacts 20 in the lower row 24 provide the desired normal contact forces between the metal balls 40 and the dimpled ends 46 of the spring contacts 20. The electrical contacts thus provided are low in resistance and very stable with environmental changes over time. The mechanical engagement of the balls 40 and the dimpled ends 46 of the spring contacts 20 provides a "detented", self-centering engagement of the separable parts of the connector system 10 when fully mated (inserted) together as shown here. They can be inserted and withdrawn repeatedly and the contact layer 42 of gold on the balls 40 will not be worn away, even though the rubbing forces inducing wear are high. Thus the gold contact surfaces are "wiped" clean when mated and are held together with a desired normal contact force for low, stable electrical connection.

Each of the metal balls 40, where it pierces a respective one of the conductive traces 30 and 32, makes tight mechanical and electrical contact with the trace at an annular zone 48. This piercing is akin to a small "pin" being driven through a thin piece of metal (e.g., a conductive trace 30 or 32). The pierced piece of metal forms itself into jagged, downturned edges (e.g., around a zone 48) which tightly grip the pin. The pin can be pushed farther through the piece of metal with relative ease, but is held tightly against being pulled out. As will be explained shortly, the small metal balls 40 are easily inserted through the conductive traces 30 and 32 and into the insulating body 12 as shown here. This is done in accordance with a method of manufacture provided by another aspect of the invention. The spring action of the annular zones 48 provides tight mechanical and electrical engagement between the metal balls 40 and the respective conductive traces 30 and 32. The balls 40 are captivated and held in exact position by the plastic insulating body 12 in conjunction with the traces 30 and 32. A particularly suitable insulating material for the body 12 will also be described shortly.

Figure 3:
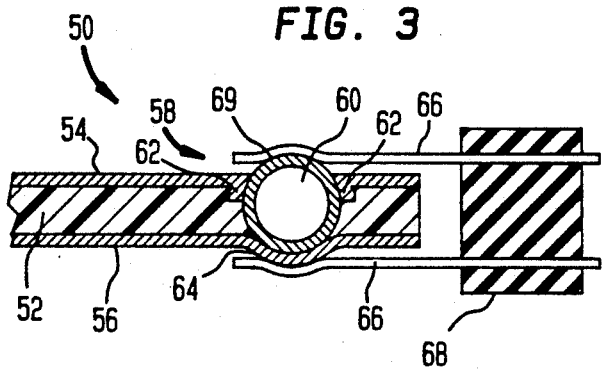
FIG. 3 is a cross-sectional view similar to FIG. 2 but showing a different connector system provided in accordance with the present invention.

Referring now to FIG. 3, there is shown a cross-sectional view of a connector system 50 in accordance with the present invention. The connector system 50 has a thin insulating body 52 on the upper face of which are bonded closely spaced conductive traces 54 (only one shown). Bonded on the lower face of the body 52 are similar conductive traces 56 (only one shown). The conductive traces 54 and 56, by way of example, can be substantially identical to the conductive traces 30 and 32 (FIGS. 1 and 2). A single row 58 of closely spaced metal balls 60 (only a single one shown) are electrically and mechanically engaged with respective ones of both the upper and lower conductive traces 54 and 56. Thus an upper trace 54 is electrically commoned with (connected to) a lower trace 56 directly underneath it by a respective one of the metal balls 60. Each metal ball 60 pierces through an upper conductive trace 54 at an annular zone 62 (akin to a zone 48 in FIG. 2). The ball 60 is driven through the thickness of the insulating body 52 down onto a respective one of the conductive traces 56 where it dimples downward the trace 56 as indicated at 64. In so doing the ball 60 makes electrical contact with the lower trace 56 and is held in engagement with it by the insulating body 52 to which the trace 56 is tightly bonded. The dimple 64 of the conductive trace 56 acts as a spring against the ball 60 urging it upward against the trace 54 at the zone 62. The exposed upper portion of the ball 60 and the downward dimple 64 of the trace 56 are engaged respectively by dimpled ends of upper and lower spring contacts 66 (like the spring contacts 20 of FIG. 2) which are rigidly held in an insulating member 68. Each ball 60 is covered with a layer 69 of gold (like the layer 42 of a ball 40 in FIG. 2).

The insulating body 52 of the connector system 50 is shown as thinner than the diameter of a metal ball 60. It may be however that the insulating body 52 is thicker than the diameter of a ball 60. In such case an elongated shape (like a football) may be used for a ball 60 so that it reaches down to the lower trace 56. Alternatively, two or more balls 60 may be stacked vertically to make electrical connection between the upper trace 54 and the lower trace 56. In this way miniature electrical "vias" (connections) can be placed as desired between spaced-apart multiple layers of conductive circuitry. The arrangement of the connector system 50 and the mating and unmating of its contacts are otherwise closely similar to those of the connector system 10 previously described (FIGS. 1 and 2).

Figure 4:
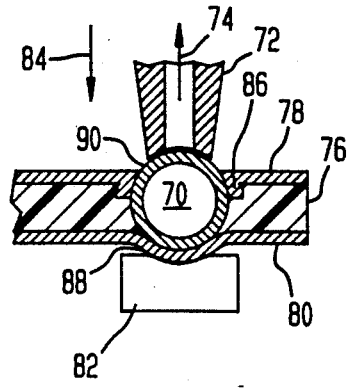
FIG. 4 is a schematic illustration of a method of manufacturing the connector systems of FIGS. 1 and 2 in accordance with another aspect of the present invention.

Referring now to FIG. 4, there is schematically illustrated a method provided by the invention of manufacturing the electrical connector assembly 50 of FIG. 3 (and also the connector assembly 10 of FIG. 1). A metal ball 70 (or a small shaped piece of metal) is held against the lower end of a hollow needle-like punch 72. Although only one ball 70 and one punch 72 are shown, it is understood that as many of these as desired may be arranged on close centers in a row perpendicular to the plane of the drawing. When a punch 72 is brought to a supply of loose balls 70, and then vacuum pressure is applied to the punch 72, as indicated by an arrow 74, a single ball 70 is sucked against the end of the punch 72 and held as shown. Then the punch 72 is positioned above and over an insulating body 76 of a connector being manufactured. The insulating body 76 has already bonded onto its upper and lower faces respectively an upper conductive trace 78 and a lower conductive trace 80 (like the traces 54 and 56 of FIG. 3). The insulating body 76 is positioned with its lower trace 80 against an anvil 82. Then the punch 72 with a metal ball 70 held against its end is driven with suitable force and speed downward, as indicated by an arrow 84, to the position shown. This action of the punch 72 and the ball 70 pierces the upper conductive trace 78 in an annular zone 86, (like the zone 62 in FIG. 3) and drives the ball 70 through the insulating body 76 and against the lower conductive trace 80. The force of the ball 80 against the lower trace 80 dimples the lower trace 80 into the top face of the anvil 82 as indicated at 88. Each of the balls 70 is thus mechanically captivated in the insulating body 76 and makes good electrical contact to the respective conductive traces 78 and 80. The ball 70 is suitably plated with a layer 90 of gold (like a ball 60).

The insulating body 76 is advantageously made of a liquid crystal polymer (wholly aromatic copolyester) which is commercially available from the Hoechst-Celanese Co. This insulating material has an extremely high heat deflection temperature (over 600°F.) and is injection moldable into thin walled shapes. This plastic has certain electrical and mechanical properties equal or superior to those of ceramic. By way of example, by heating the insulating body 76 made of this material to an elevated temperature in the range from about 100°F. to 200°F., the driving of a ball 70 into or through a portion of the material is substantially enhanced. When the ball 70 and the body 76 return to ambient temperature (e.g., 70°F.), and thermal equilibrium is established, the ball 70 is tightly captivated in the body 76 with what amounts to a heat-shrink fit. The elevated temperature is safely below the melting point of the insulating body 76 (e.g., well over 700°F.). If desired in order to facilitate the piercing of the conductive trace 78 by the ball 70, the trace may be pre-etched in the vicinity of the zone 86 into tiny spring-like fingers (not shown). If further desired, the conductive traces 78 (and traces 80) can be solder-plated prior to the insertion of the ball 70. Then with the ball 70 in the position shown in FIG. 5, the plating is quickly reflowed thereby also "soldering" the ball 70 to the traces 78 and 80. The exposed top of the ball 70 remains free of solder after reflow and provides a gold contact interface. It is of course understood that the connector system 10 (FIG. 2) can be fabricated by substantially the same method illustrated in FIG. 5.

It is to be understood that the connector systems and method described herein are illustrative of the general principles of the invention. Modifications may readily be devised by those skilled in the art without departing from the spirit and scope of the invention. For example, the invention is not limited to a particular number of contacts or size of balls, or to the specific materials described. Different punches and anvils and temperatures other than those disclosed can be used. Still further, conductive circuitry of different designs from that disclosed may be employed.

What is claimed is:

1. An electronic connector system comprising:
   a body of plastic insulating material;
   a plurality of conductive traces supported by the body;
   a plurality of pieces of metal seated in mechanical and electrical engagement with respective ones of the conductive traces and captivated by surrounding portions of the plastic insulating material; and
   spring contacts adapted to bear against exposed portions of the respective metal pieces with a desired contact force.

2. The connector system of claim 1 wherein the metal pieces are generally spherical in shape and are covered by a layer of gold.

3. The connector system of claim 1 wherein the metal pieces are pierced through respective ones of the conductive traces in an annular zone, the edges of the zone providing tight spring contact to the metal pieces.

4. The connector of claim 1 wherein the plastic insulating material is a liquid crystal polymer.

5. The connector system of claim 1 wherein the metal pieces are balls about 10 mils in diameter.

6. The connector system of claim 5 wherein the ends of the spring contacts are dimpled and mate with the balls to provide a self-aligning wiping action and a desired normal contact force.

7. An electronic connector system comprising:
   a body of plastic insulating material;
   a plurality of thin metal conductive traces supported on two levels by the body;
   a plurality of small metal balls seated in mechanical and electrical engagement with respective ones of the conductive traces on two levels, the balls being captivated by surrounding portions of the plastic insulating material, respective ones of the balls providing electrical connections between the two levels of conductive traces; and
   spring contacts adapted to bear against exposed portions of the respective balls with a desired contact force.

8. The electronic connector system of claim 7 wherein the balls are elongated in shape.

9. The electronic connector of claim 7 wherein a plurality of balls are stacked together and form a single connection between conductive traces.

10. The electronic connector system of claim 7 wherein two levels of conductive traces are respectively bonded to the top and the bottom of the insulating body, and a ball projects down through a top trace, through the insulating body and tightly against a bottom trace.

11. The electronic connector system of claim 10 wherein the bottom trace is dimpled and provides spring force against the ball.

12. An electronic connector system comprising:
   a body of plastic insulating material;
   a plurality of thin metal conductive traces bonded to the body;
   a plurality of small metal balls having exposed portions and piercing respective ones of the conductive traces and projecting into the plastic body and being captivated thereby; and
   spring contacts adapted to bear against exposed portions of the respective balls with a desired contact force.

13. The electronic connector of claim 12 wherein the balls are covered with a layer of gold and the conductive traces are solder plated, the balls and traces being re-flow soldered together.

14. The electronic connector of claim 13 wherein the plastic body is made of liquid crystal polymer having a melt temperature in excess of 600°F.

* * * * *